(12) United States Patent
Pon

(10) Patent No.: US 6,800,918 B2
(45) Date of Patent: Oct. 5, 2004

(54) EMI AND NOISE SHIELDING FOR MULTI-METAL LAYER HIGH FREQUENCY INTEGRATED CIRCUIT PROCESSES

(75) Inventor: Harry Q. Pon, Carmichael, CA (US)

(73) Assignee: Intel Corporation, Santa Clara, CA (US)

(*) Notice: Subject to any disclaimer, the term of this patent is extended or adjusted under 35 U.S.C. 154(b) by 170 days.

(21) Appl. No.: 09/836,973

(22) Filed: Apr. 18, 2001

(65) Prior Publication Data
US 2002/0155655 A1 Oct. 24, 2002

(51) Int. Cl.[7] .................. H01L 29/00; H01L 21/8234
(52) U.S. Cl. ............................ 257/528; 438/238
(58) Field of Search ..................... 257/528, 531, 257/532, 535, 536, 538, 549, 537; 438/6, 238, 239, 241, 242, 243, 244–248

(56) References Cited

U.S. PATENT DOCUMENTS

| | | | |
|---|---|---|---|
| 5,686,330 A * 11/1997 | Farb et al. | ............... | 438/193 |
| 5,742,091 A * 4/1998 | Hebert | ............... | 257/531 |
| 5,935,868 A * 8/1999 | Fang et al. | ............... | 438/692 |
| 6,051,869 A * 4/2000 | Pan et al. | ............... | 257/506 |
| 6,143,614 A * 11/2000 | Nasserbakht | ............... | 438/381 |
| 6,172,378 B1 * 1/2001 | Hull et al. | ............... | 257/14 |
| 6,198,168 B1 * 3/2001 | Geusic et al. | ............... | 257/774 |
| 6,232,662 B1 * 5/2001 | Saran | ............... | 257/750 |
| 6,252,290 B1 * 6/2001 | Quek et al. | ............... | 257/522 |
| 6,281,583 B1 * 8/2001 | Dirahoui et al. | ............... | 257/752 |
| 6,348,391 B1 * 2/2002 | Fattaruso | ............... | 438/381 |
| 6,407,441 B1 * 6/2002 | Yuan | ............... | 257/531 |
| 6,437,401 B1 * 8/2002 | Mandelman et al. | ............... | 257/330 |
| 6,441,419 B1 * 8/2002 | Johnson et al. | ............... | 257/296 |
| 6,445,026 B1 * 9/2002 | Kubota et al. | ............... | 257/296 |
| 6,455,915 B1 * 9/2002 | Wong | ............... | 257/531 |
| 6,524,926 B1 * 2/2003 | Allman et al. | ............... | 438/387 |
| 6,667,217 B1 * 12/2003 | Hsu et al. | ............... | 438/381 |
| 2003/0067052 A1 * 4/2003 | Matsuo et al. | ............... | 257/531 |

* cited by examiner

Primary Examiner—James Vannucci
Assistant Examiner—Minh Dieu A
(74) Attorney, Agent, or Firm—Trop, Pruner & Hu, P.C.

(57) ABSTRACT

A circuit element that may generate or be affected by noise or electromagnetic interference may be substantially surrounded by one or more encircling plugs. The encircling plug may be closed by an interconnection layer. The plug may be grounded to reduce the electromagnetic interference or noise generated by or coupled to said passive circuit element.

15 Claims, 6 Drawing Sheets

EMI AND NOISE SHIELDING FOR MULTI-METAL LAYER HIGH FREQUENCY INTEGRATED CIRCUIT PROCESSES

BACKGROUND

This invention relates generally to integrated circuits including integrated circuits with passive components such as inductors or capacitors and integrated circuits with active elements such as transistors.

A variety of integrated circuits may include passive components such as inductors or capacitors. For example, radio frequency circuits utilized in connection with radio transceivers or cellular telephones may include both logic elements, mixed signal elements and analog elements.

In some cases, noise or electromagnetic interference produced by the passive or active components may interfere with the operation of other passive or active components or components formed in the same substrate with the passive components. For example, complementary metal oxide semiconductor structures may be formed that define logic elements as well as radio frequency elements having passive components. Integrated capacitors or inductors may be formed over the same substrate that includes logic elements. The substrate may be formed of silicon or germanium material as examples.

In many cases, the high frequency radio frequency devices may be formed on separate integrated circuits to avoid interference between logic devices and components that operate in radio frequency range. This avoids the problem of noise being coupled through the substrate. However, using separate integrated circuits significantly increases the cost of the combined circuitry. Integration of more components into the same integrated circuit generally reduces costs. Moreover, integration into the same circuit normally also results in higher performance.

Thus, there is a need for techniques that facilitate the formation of active and passive circuit components, operating for example a high frequencies, on the same semiconductor substrate that also includes other components such as logic devices.

DETAILED DESCRIPTION

Figure 1:
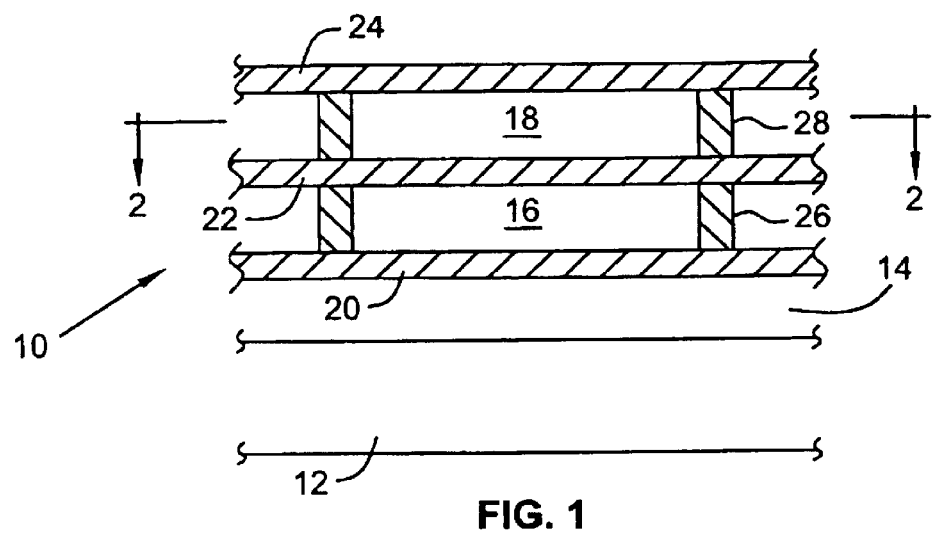
FIG. 1 is a greatly enlarged, partial cross-sectional view through one embodiment of the present invention.

Referring to FIG. 1, an integrated circuit 10 may include a semiconductor substrate or structure 12 formed from a wafer of semiconductor material. The semiconductor material may include silicon as one example or silicon and germanium, germanium, or gallium arsenide, as additional examples. The circuit 10 may use a bipolar, complementary metal oxide semiconductor (CMOS), silicon or insulator (SOI), or biCMOS technology.

Over the semiconductor structure 12, one or more interconnection layers such as the interconnection layers 20, 22 and 24 may be defined. Interconnection layers are also sometimes called metal layers, metallizations or polysilicon layers. The layers 20, 22 and 24 are conventionally formed as part of an existing process involving the deposition of a conductive material, such as a metal, polysilicon or a silicide, and patterning the deposited conductive material. As a result, interconnections may be made between interconnection layers and the structure 12 or between devices coupled through a single interconnection layer. Thus, the use of interconnection layers such as the layers 20, 22 and 24 facilitates the interconnection of circuit devices that may be formed on or above the semiconductor structure 12.

While the illustrated embodiment shows three interconnection layers 20, 22 and 24, additional layers may be included either above or below the layers depicted. The interconnection layers 20, 22 and 24 are separated by insulation layers 14, 16 and 18 which conventionally are formed of a dielectric such as oxide.

The resulting integrated circuit 10 includes one or more interconnection layers such as the layer 20 positioned over the semiconductor structure 12. Vertical conductive elements or plugs 26 and 28 may be formed between successive pairs of overlaying interconnection layers such as the layers 20 and 22 and the layers 22 and 24, in one embodiment of the present invention. In other embodiments, a plug 26 may be formed between the semiconductor structure 12 and an overlaying interconnection layer 20.

Figure 11:
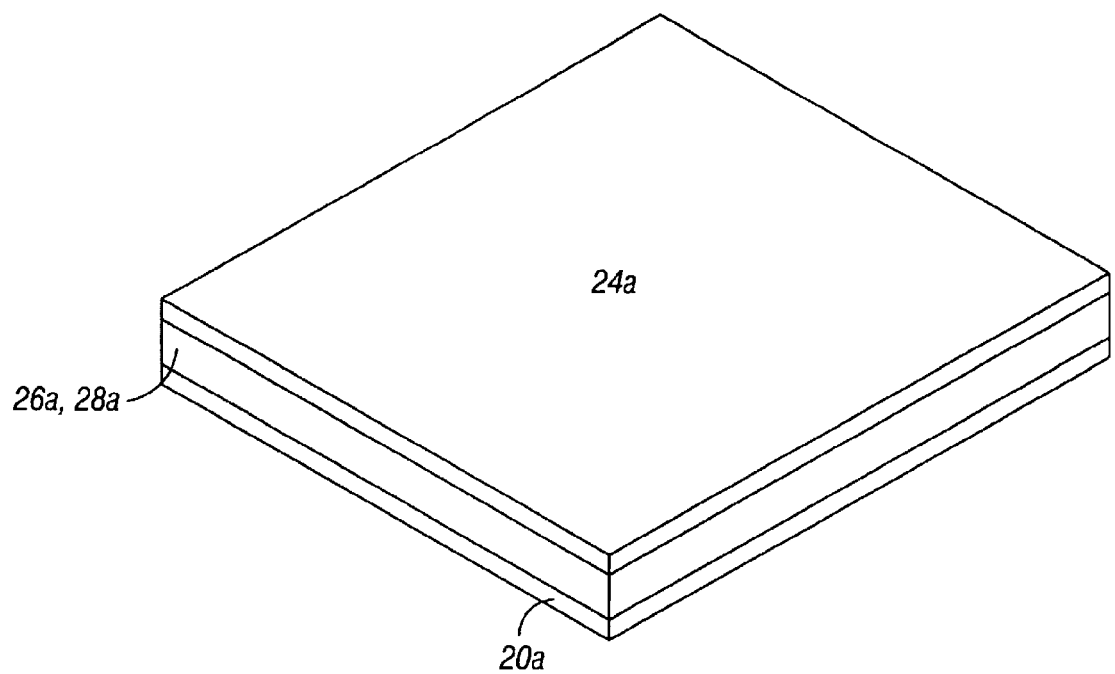
FIG. 11 is a schematic depiction of one embodiment of the present invention.

The concept of the enclosure formed by layers 20 and 22 and plugs 26 and 28 is further illustrated in connection with FIG. 11, which shows a structure removed from the substrate in three dimensions. An upper plate 24A may be formed of a metallization layer, a polysilicon layer, or even a doped semiconductor layer. The bottom layer 20A can be formed of any of the above possibilities. The intervening wall of the resulting structure, 26A, 28A may be formed of vertically disposed plugs, as one example. The component, active or passive, to be isolated is generally defined within the enclosure depicted in FIG. 11. Thus, effectively an enclosure may be formed, which completely surrounds and thereby isolates the enclosed active or passive component.

Figure 2:
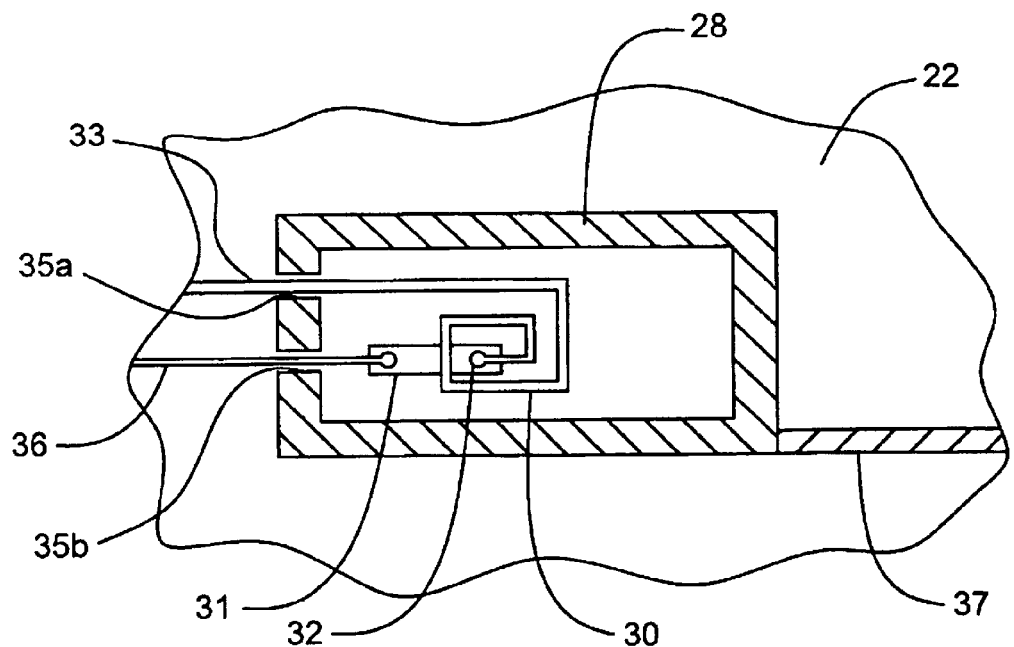
FIG. 2 is an enlarged cross-sectional view taken generally along the line 2—2 in FIG. 1.

As shown in FIG. 2, a passive circuit element 30 may be formed in an interconnection layer 22 in one embodiment of the present invention. In the illustrated example, the passive circuit element 30 includes a spiral, flat inductor with a contact 32. The element 30 may develop inductance when current is conducted between the contact 32 and a conductive line 33 that extends through an opening 35a defined in the plug 28. The contact 32 may be coupled, for example by a buried layer 31 and a line 36, to other circuit elements (not shown). The term buried layer is intended to refer to a doped layer that extends through a semiconductor substrate.

Where plugs 28 or 26 extend both above and below the passive circuit element 30, the enclosure formed by the encircling or surrounding plugs 26 and 28 may be substantially closed by underlying interconnection layer 20 and overlying interconnection layer 24. The layers 20 and 24 may be horizontal plates in one embodiment. A passive circuit element 30 may be effectively shielded from other circuit elements also provided on the integrated circuit 10 and vice versa. That is, the layers 20, 22 and 24 as well as the plugs 26 and 28 may be formed of a material that reduces either or both of the noise or electromagnetic interference (EMI) arising from the passive or active circuit elements 30 or from surrounding devices coupled to the element 30. In one embodiment the enclosure may be bounded on a lower side by a well such as a P or N well.

In one embodiment of the present invention, the plugs 26 and 28 are coupled by a conductive line 37 in one of the interconnection layers 20, 22, 24 to a ground connection so that the overall surrounding structure is grounded. In one embodiment, the material utilized to form the plugs 26 and 28 may be a metallic material such as tungsten or aluminum as two examples. The plugs 26, 28 may be coupled to the ground, $V_{CC}$, or some other potential or they may float.

Figure 3:
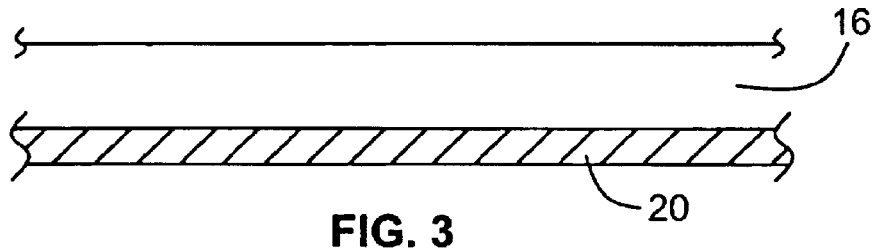
FIG. 3 is an enlarged, partial cross-sectional view illustrating the fabrication process for the structure shown in FIG. 1 in accordance with one embodiment of the present invention.
Figure 4:
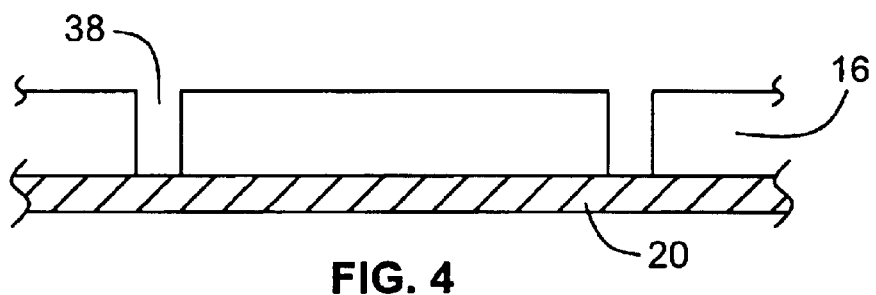
FIG. 4 shows a cross-sectional view of a subsequent step in the fabrication process shown in FIG. 3.
Figure 5:
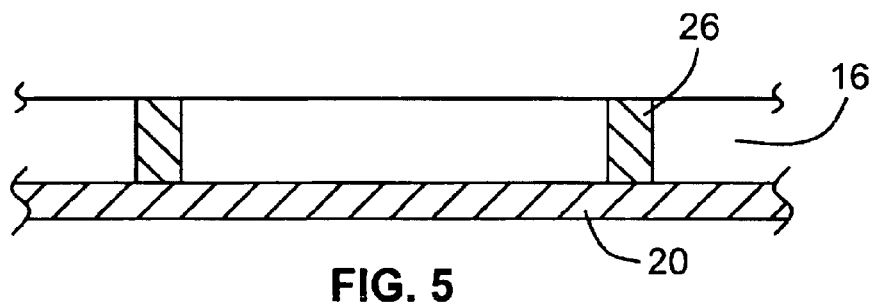
FIG. 5 shows a subsequent step in the fabrication process also shown in FIGS. 3 and 4.

Referring to FIG. 3, a process for forming the semiconductor device 10, in accordance with one embodiment of the present invention, begins by forming an insulation layer 16 over a layer 20. Thereafter, as shown in FIG. 4, a trench 38 may be formed in the insulation layer 16 using conventional patterning techniques. The trench 38 may then be filled with metallic material to create a plug 26 that substantially surrounds a portion of the interconnection layer 20 containing the passive or active circuit element 30 as shown in FIG. 5.

Figure 6:
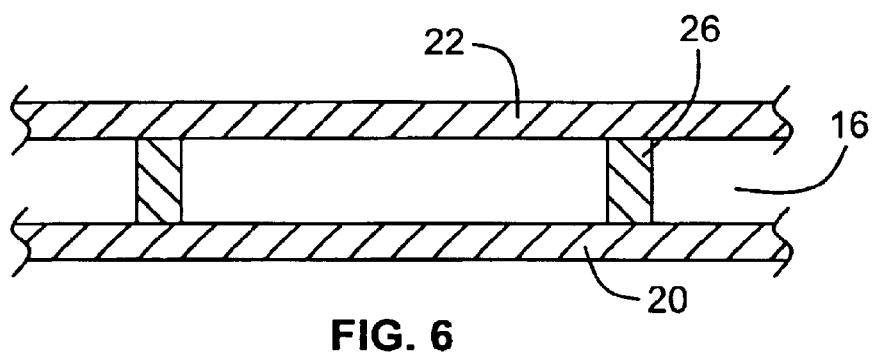
FIG. 6 shows a subsequent step in the fabrication process also shown in FIGS. 3 through 5.

Thereafter, referring to FIG. 6, an overlying interconnection layer 22 may be formed over and electrically coupled to the plug 26. In one embodiment of the present invention, the layer 22 may be patterned to define a passive circuit element 30 such as an inductor or a capacitor. In some embodiments, an inductor may be formed from one or more interconnection layers and an appropriate surrounding shield formed from plugs 26 and 28 may be defined between a plurality of overlying interconnection layers.

Advantageously, the plugs 26 and 28 substantially surround the passive circuit element 30 to prevent the coupling of noise or other signals. However, in some cases, relatively small openings, such as the opening 35, may be permitted for interconnection purposes. As one example, the opening may be a zigzag opening to reduce the noise coupling.

Figure 7:
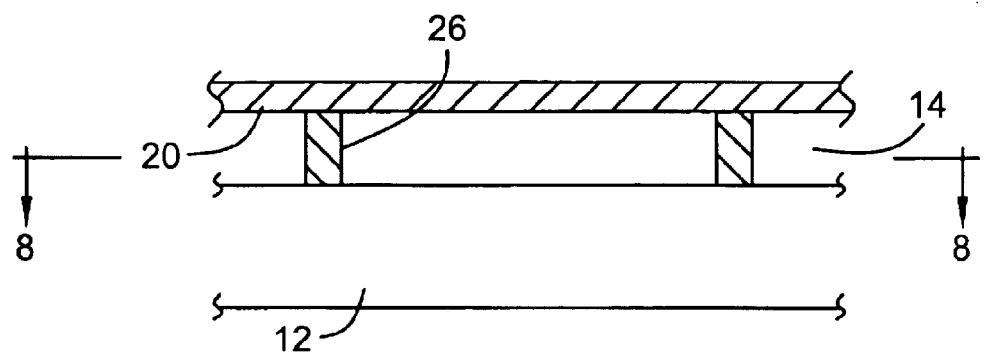
FIG. 7 is a greatly enlarged, partial cross-sectional view through another embodiment of the present invention.

Referring to FIG. 7, in accordance with another embodiment of the present invention, a plug 26 may extend from the semiconductor structure 12 to an interconnection layer 20 through an insulation layer 14. A passive circuit element (not shown in FIG. 7) may be formed over or on the semiconductor structure 12. The inverted U-shaped structure defined by the interconnection layer 20 and the plug 26 may substantially or completely enclose the passive circuit element. For example, the passive circuit element may be formed with an active device on the structure 12 or may be formed in connection with a polysilicon layer associated with the structure 12.

Figure 8:
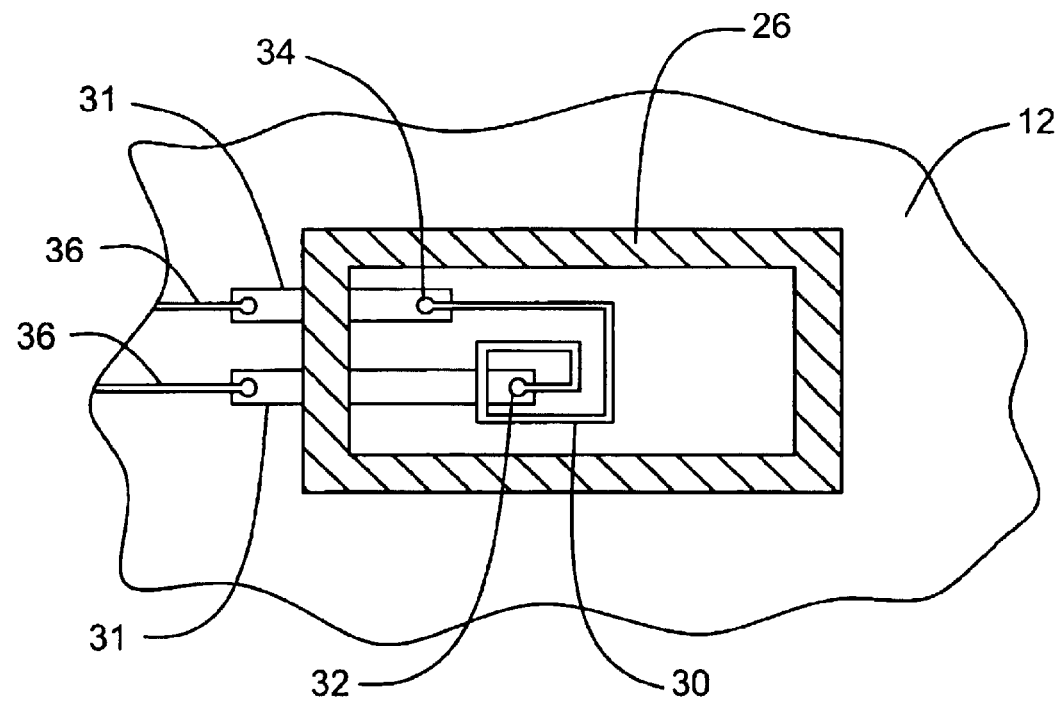
FIG. 8 is an enlarged, cross-sectional view taken generally along the line 8—8 in FIG. 7.

Referring to FIG. 8, a passive circuit element 30 such as a flat spiral inductor, may be formed with contacts 32 and 34. The contacts 32 and 34 may make contact with overlying or other passive components such as underlying circuit elements such as active components included on the semiconductor structure 12. Thus, inductive effects may be provided by the spiral shape of the element 30 when current passes between the contacts 34 and 32. The contacts 32 and 34 may be coupled to lines 36 through vias (not shown) or buried contacts 31 that may extend vertically under the plug 26 and through the integrated circuit 10 in accordance with one embodiment of the present invention. The plug 26 may be grounded through a line (not shown) in the layer 20.

Figure 9:
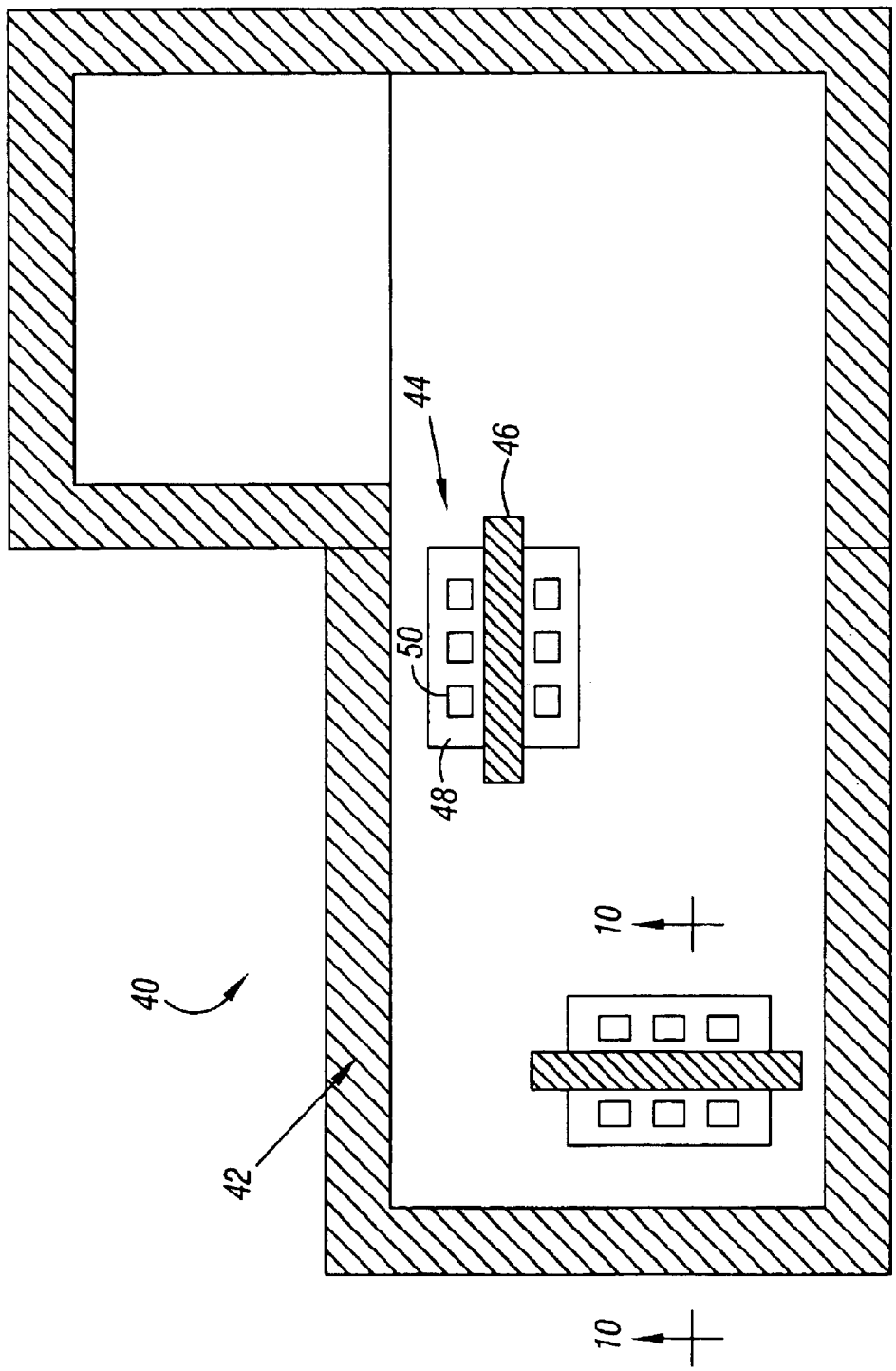
FIG. 9 is an enlarged top plan view of another embodiment of the present invention.

Referring to FIG. 9, the semiconductor structure 40 may integrate not only passive components but also active components such as active areas 44 including metal oxide semiconductor field effect transistors (MOSFETs) formed from doped regions on diffusions 50 and gates 46. The active regions 44 are surrounded by a guard ring 42 that extends into the structure 40 and may be formed as a substrate diffusion. Thus, the guard ring 42 may provide intrasubstrate isolation from EMI and other spurious signals.

Figure 10:
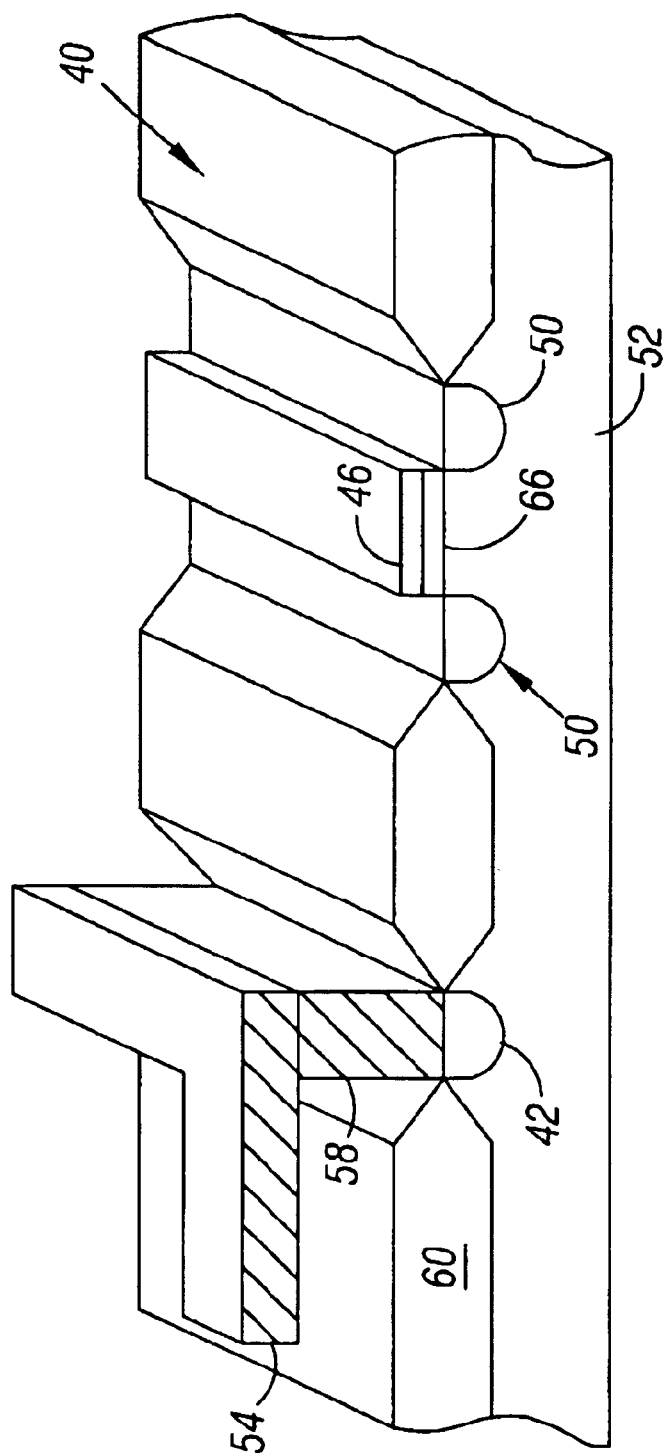
FIG. 10 is an enlarged cross-sectional view taken generally along the line 10—10 in FIG. 9.

Referring to FIG. 10, the structure 40 may include the intrasubstrate guard ring 42. The guard ring 42 may completely encircle the active areas 44 including the source and drain diffusions 50, the gate 46 and the gate dielectric 66. The guard ring 42 and the source and drain diffusions 50 may all be formed in the substrate 52. Field oxide isolation 60 may be formed over the substrate 52.

Extending upwardly from the guard ring 42 is a metallic or conductive plug 58. Like the guard ring 42, the plug 58 may extend completely around the areas 44 that include the transistors formed from diffusions 50 and gates 46. As a result, the upstanding plug 58 provides isolation for components situated over the substrate 52 from noise from surrounding components and shields surrounding components from noise generated by devices within the plug 58 enclosed region.

In one embodiment of the present invention, an electrical connection may be from the plug 58 to a guard ring connection 54. The guard ring connection 54 may be a metal line, for example formed in a metal one layer, in one embodiment of the present invention, that connects to ground or other suitable potential for appropriately biasing the guard ring 42. In other embodiments of the present invention, an intermediate metal layer may be formed between the substrate 52 and the metal one layer to act as a cap over the top of the active areas 44.

Thus, with the embodiment shown in FIGS. 9 and 10, both active and passive components may be isolated from spurious signals such as EMI noise or external components. The protection may be provided in the region between metal layers and the substrate, between metal layers themselves and beneath the substrate by virtue of the guard ring 42.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:

a semiconductor substrate;

an interconnection layer positioned over said substrate;

a passive circuit element between said substrate and said interconnection layer; and a trench that encircles said passive circuit element, said trench filled with a conductive material.

2. The circuit of claim 1 wherein said trench substantially encircles said passive circuit element.

3. The circuit of claim 2 wherein said material includes an opening for an electrical connection to said passive circuit element.

4. The circuit of claim 1 wherein said passive circuit element is a flat spiral inductor.

5. The circuit of claim 1 including first, second and third interconnection layers, said passive circuit element formed in said second interconnection layer and a pair of metal-filled trenches extending between said first and second interconnection layers and said third and second interconnection layers.

6. The circuit of claim 1 wherein said trench extends from said interconnection layer to said substrate.

7. The circuit of claim 1 wherein said material is grounded.

8. The circuit of claim 1 including a buried contact which couples said passive circuit element under said material.

9. The circuit of claim 1 wherein said material and said interconnection layer are electrically coupled.

10. An integrated circuit comprising:

a semiconductor substrate;

an active circuit element formed in said substrate;

a guard ring encircling said active circuit element formed in said substrate; and a conductive material formed over and contacting said guard ring, said conductive material encircling said active circuit element.

11. The circuit of claim 10 wherein said material couples to a guard ring connection layer to bias said guard ring.

12. The circuit of claim 10 including a metal one layer over said substrate, said material electrically coupled to said guard ring and said metal one layer.

13. The circuit of claim 10 wherein said guard ring completely surrounds said active circuit element.

14. The circuit of claim 10 wherein said active circuit element includes a transistor.

15. The circuit of claim 10 wherein said active circuit element is enclosed in a shield over the substrate, said shield formed by said material and an overlying metal layer.

* * * * *